United States Patent [19]

Sasaki

[11] Patent Number: 5,226,930
[45] Date of Patent: Jul. 13, 1993

[54] METHOD FOR PREVENTING AGGLOMERATION OF COLLOIDAL SILICA AND SILICON WAFER POLISHING COMPOSITION USING THE SAME

[75] Inventor: Shigeo Sasaki, Yokkaichi, Japan

[73] Assignee: Monsanto Japan, Ltd., Tokyo, Japan

[21] Appl. No.: 851,877

[22] Filed: Mar. 16, 1992

Related U.S. Application Data

[63] Continuation-in-part of Ser. No. 425,172, Oct. 13, 1989, abandoned.

[30] Foreign Application Priority Data

Jun. 3, 1988 [JP] Japan ............................... 63-135451
Mar. 22, 1989 [JP] Japan ................................... 1-69881

[51] Int. Cl.$^5$ ............................................... B24D 3/02
[52] U.S. Cl. ...................................... 51/308; 106/3; 106/287.11; 106/287.13; 106/287.14
[58] Field of Search .................... 51/308; 106/3, 287.1, 106/287.11, 287.13, 287.14

[56] References Cited

U.S. PATENT DOCUMENTS

| | | | |
|---|---|---|---|
| 4,057,939 | 11/1977 | Basi | 106/3 X |
| 4,462,188 | 7/1984 | Payne | 106/3 X |
| 4,588,421 | 5/1986 | Payne | 51/308 |
| 4,664,679 | 5/1987 | Kohyama et al. | 51/308 |

FOREIGN PATENT DOCUMENTS

| | | | |
|---|---|---|---|
| 2305188 | 8/1974 | Fed. Rep. of Germany | 106/3 |
| 2910807 | 9/1980 | Fed. Rep. of Germany | 106/3 |
| 0600160 | 3/1978 | U.S.S.R. | 106/3 |

*Primary Examiner*—Karl Group
*Attorney, Agent, or Firm*—Sherman and Shalloway

[57] ABSTRACT

A method is provided for preventing agglomeration of a colloidal silica comprising trialkylsilyating part of silanol groups on the surface of silica particles of the colloidal silica with a trialkylhalosilane or a hexaalkyldisilazane in an amount from about 0.1–10 mole % based on the silanol groups on the surface of the silica particles.

6 Claims, No Drawings

METHOD FOR PREVENTING AGGLOMERATION OF COLLOIDAL SILICA AND SILICON WAFER POLISHING COMPOSITION USING THE SAME

This application is a continuation-in-part of copending application Ser. No. 07/425,172, filed Oct. 13, 1989, now abandoned.

BACKGROUND OF THE INVENTION

1. Field of the Invention

This invention relates to a method for preventing agglomeration of a colloidal silica by trialkylsilylating, in part, the silanol groups of silica particles contained in the colloidal silica, and to the composition for a silicon wafer polishing containing a colloidal silica containing partially trialkylsilylated silica particles.

2. Description of the Prior Art

Surfaces of silicon wafers used as substrates in the production of semiconductor devices such as integrated circuits are mirror-polished and then subjected to the formation of circuits.

There have heretofore been proposed various types of polishing compositions for polishing the surface of silicon wafers. For example, in the specification of U.S. Pat. No. 3,170,273, a silica sol having a silica concentration of 2 to 50% by weight and a silica gel having a silica concentration of 2 to 100% by weight are disclosed as polishing compositions. The specification of U.S. Pat. No. 3,328,141 discloses that the polishing speed is increased by mixing these polishing compositions with an alkaline compound to adjust the pH value to 10.5 to 12.5.

Furthermore, the specification of U.S. Pat. No. 4,664,679 discloses that silicic anhydride obtained by a dry method is surface treated with silane-based or other coupling agents to prepare a stable silica aqueous dispersion composition, which is applied as a polishing agent.

For polishing silicon wafers, colloidal silica is widely used for its small particle sizes over aqueous dispersion compositions of silicic anhydride.

However, colloidal silica, because it has chemically active silanol groups in a high density on the surface of silica particles, tends to undergo gelation during drying or, even as is, produce coarse silica particle agglomerations. When polishing slurry is contaminated with a gelled matter from the slurry supply or agglomerations which produce coarse silica particles are present, the polishing slurry tends to cause scratches or latent flaws on the wafer surface during polishing of the silicon wafers.

These scratches and latent flaws present on the silicon wafers are not preferable since they lead to uneven electrical characteristics of circuits when the circuit patterns are formed on the surface of the silicon wafers using oxide film formation, etching, and doping techniques.

Therefore, the polishing slurry must be strictly controlled so as not to be contaminated with dried gelation products or coarse silica particle agglomerations, but there is no method for checking the polishing slurry whether or not it is contaminated with dried gelation products or agglomerations, which can only be determined from the polished silicon wafers.

On the other hand, in an aqueous dispersion composition of silicic anhydride, even when dried, the gelation products are not high in mechanical strength and can easily be broken, but stability of an aqueous dispersion composition of silicic anhydride has been inferior to that of colloidal silica.

With a view to eliminate the above prior art problems, it is a primary object of the present invention to provide a polishing composition for silicon wafers, in which silica particles in a colloidal silica is modified so that even when the colloidal silica is dried and gelled, it can easily be repulverized by a weak mechanical action, and that it has less tendency to generate coarse silica particles, to obtain the polishing composition containing such a modified colloidal silica, thereby preventing generation of scratches or latent flaws on the surface of silicon wafers during polishing.

DISCLOSURE OF THE INVENTION

In accordance with the present invention which attains the above object, there is provided a method for trialkylsilylation with a trialkylhalosilane or a hexaalkyldisilazane of part of the silanol groups on the surface of silica particles, and also provided a silicon wafer polishing composition comprising the colloidal silica modified by the above method.

The present invention will now be described in detail. Colloidal silica (hereinafter referred to as "CLS") used in the present invention, as described in detail in Chapter 3 of "The Chemistry of Silica", Ralph K. Iller, John Wiley & Sons (1979), is one which is obtained by the following process:

PROCESSES (1) An activated silicic acid aqueous solution is obtained by cationic exchange of sodium silicate aqueous solution.

(2) The activated silicic acid aqueous solution itself is acidic, and when the acidic state is maintained, it becomes a jelly-like bulk gel, but in alkaline state at a high temperature (for example, 100° C.), silica particles are produced in the aqueous solution. Since the activated silicic acid forms silica particles through a dehydration condensation reaction, the activated silicic acid in aqueous solution is consumed, and the reaction system becomes basically composed of water, silica particles, and the base added to make the solution alkaline. This is referred to as CLS.

In the actual CLS production process, during the cationic exchange of sodium silicate aqueous solution, the sodium silicate concentration of the sodium silicate aqueous solution is controlled to 4 to 8% by weight in order to prevent gelation of the activated silicic acid produced, the silica particles are grown at that concentration, and the solution finally concentrated to a necessary silica concentration.

Since the silica particles are very small in particle size, they can maintain a stable dispersion condition even in aqueous media.

The modified colloidal silica used in the present invention is referred to as a colloidal silica of which part of silanol groups on the surface of silica particles are trialkylsilylated with trialkylhalosilane or hexaalkyldisilazane. Due to the modification, the modified colloidal silica makes particles of a silicon wafer polishing composition containing the same less liable to agglomerate and, even once agglomerated, reduce mechanical strength of the agglomerated particles to make them easily redispersible by a small mechanical force.

The silicon wafer polishing concentrated composition of this invention mainly comprises modified colloidal silica, an alkaline substance to improve the polishing speed, a water-soluble polymer to control the stability of the liquid, and water which is the medium for the water-soluble polymer. The concentrated composition can be diluted with water to obtain a polishing slurry composition, which is used for polishing wafers. The silica concentration of the slurry is 0.1 to 10% by weight, preferably 1 to 5% by weight.

The average particle diameter of the silica particles in the colloidal silica used is greater than 5 millimicrons and smaller than 1 micron. If the average particle diameter is 5 millimicrons or less, the particles tend to contain increased amounts of silicic acid monomer and oligomers, which tend to adhere as silica to the surface of silicon wafers when the wafers are polished with a modified colloidal silica containing large amounts of such ingredients and, if the average particle diameter is 1 micron or more, they tend to generate scratches on the surface of silicon wafers. Both of these cases are undesirable.

The modified colloidal silica in the present invention is obtained by trialkylsilylation of silanol groups on the surface of the silica particles. Specifically, the trialkylsilylation is accomplished by reacting silanol groups on the surface of the silica particles with trialkylhalosilane or hexaalkyldisilazane. The trialkylhalosilane includes those compounds having 10 or less carbon atoms such as trimethylhalosilane, triethylhalosilane, and tripropylhalosilane. For example, trimethylsilane halides such as trimethylchlorosilane, trimethylbromosilane, trimethylfluorosilane, and trimethyliodosilane, and tripropylhalosilanes such as tripropylchlorosilane are preferable, especially trimethylhalosilane is the most preferable.

In the trialkylsilylation of silanol groups on the surface of the silica particles, it is preferable to use trialkylhalosilane or hexaalkyldisilazane in an amount of 0.1 to 10 mole % based on the silanol groups on the surface of the silica particles. If less than 0.1 mole % of this compound is used, because the coverage of the silanol groups on the surface of the silica particles are still sufficiently high to form siloxane bonds between the silica particles, the formation of agglomerations in the colloidal silica is not suppressed and the dried gel products are hard, which are not desirable for the purpose of the present invention. If more than 10 mole % of the compound is used, due to excessive hydrophobicity of the silica particles, the polishing efficiency tends to lower, which is not desirable.

One molecule of hexaalkyldisilazane hydrolysis into two molecules of trialkylsilanol, which reacts with silanol groups on the silica particles, thus achieving trialkylsilylation.

Yield rate of the reaction between silanol groups and hexaalkyldisilazane, depending on the conditions, is more than 30% in an acid solution. If the reaction is carried out in an alkaline solution, the hydrolytic reaction of hexaalkyldisilazane does not sufficiently proceed and, in turn, formation of trialkylsilanol is insufficient.

While there are various quantitative analysis methods for silanol groups on the surface of the silica particles in the colloidal silica, it is preferable to use a method in which the colloidal silica is mixed with a benzene solution of methyl red and, after vigorous agitation, the amount of silanol groups is determined from a reduction in amount of methyl red in the benzene solution. Methyl red concentration in benzene can be determined with good precision by a spectrometric method. Details of this analysis method are described in J. Am Chem. Soc. 776, 72(1950). Although this method is difficult to determine the amount of silanol groups at an accuracy of 0.1% or better, since the trialkylhalosilane rate of silanol is over 0.1% in the present invention, this method is sufficient for the purpose.

Since the trialkylsilylation of silanol groups on the surface of the silica particles is a heterogeneous reaction, the entire surface of the silica particles is not completely trialkylsilylated but there remain unmodified particles.

The pH value of the slurry-formed polishing composition can be adjusted using an alkali metal hydroxide, aqueous ammonia, or an amine. It is preferable to adjust the pH value at 8 to 12, and typically that of 10 to 11 is used for polishing. A pH value higher than 12 tends to roughen the surface, and a pH value lower than 8 tends to have insufficient polishing efficiency. Therefore, either of these cases is not preferable.

To increase the polishing speed, it is advantageous to add ethylenediamine to the concentrated polishing composition or slurry. A polyamine such as ethylenediamine, for conventional colloidal silica, has an effect to agglomerate silica particles and is thus not preferable additives to a concentrated polishing composition or slurry but, for the concentrated polishing composition or slurry according to the present invention containing modified colloidal silica of which the surface of the silica particles is partly trimethylsilyated, this agglomeration is considerably suppressed, such a polyamine can be added.

The present invention provides the following specific effects and can thus be used to good advantage in industrial applications.

(1) Since the composition has a low density of silanol groups on the surface of the silica particles, the formation of siloxane bonds between the particles is suppressed and no silica particle agglomerations occur. Thus, when the polishing slurry composition of this invention is used for polishing silicon wafers, generation of crystal defects due in polishing of the silicon wafer is prevented.

(2) Since dried products of the inventive polishing slurry composition have weak siloxane bonds between particles, the dry solid can be readily pulverized by a small force. This is an outstanding effect in view of the fact that dry solids of polishing slurry compositions using conventional art colloidal silica are hard like glass.

EXAMPLES

The present invention will now be described in further detail with reference to the Examples and Comparative Example, but the following Examples are intended to illustrate, not limit the invention.

EXAMPLE 1

As colloidal silica, 1 kg of "Syton HT-50" (from Mitsubishi Monsanto Chemical, with an average silica particle diameter of 60 millimicrons and a silica content of 50% by weight) was mixed under efficient agitation with 1 g of trimethylchlorosilane, to react silanol groups on the surface of the silica particles in the colloidal silica with the trimethylchlorosilane, achieving trimethylsilylation. This reaction releases hydrochloric acid, which increases the hydrogen ion concentration, and the pH value of the colloidal silica decreases.

The colloidal silica, which is stabilized at an alkaline pH value but unstable at a neutral pH, was reacted in the presence of an anionic exchange resin in the reaction system to remove chloride ions released. The anionic exchange resin used was "Dia-Ion SA10A"(from Nippon Rensui). The resin was used in an amount of 10 ml. The reaction was carried out at room temperature for over 1 hour. After the completion of the reaction, the ion exchange resin was filtered out to obtain a modified colloidal silica as a concentrated polishing composition.

EXAMPLE 2

"Syton HT-50" (same as used in Example 1) was used as colloidal silica, which was previously treated with a cationic exchange resin to remove alkali metal ions from the aqueous phase and to acidify.

1 kg of the acidified colloidal silica was mixed under agitation with 1 g of trimethylchlorosilane to react silanol groups on the surface of the silica particles in the acidified colloidal silica with the trimethylchlorosilane, achieving trimethylsilylation.

The reaction was carried out in the presence of an anionic exchange resin to remove chloride ions released. The anionic exchange resin used was "Dia-Ion SA10A"(same as used in Example 1). The resin was used in an amount of 10 ml. The reaction was carried out at room temperature for over 1 hour. After the completion of the reaction, the ion exchange resin was filtered out to obtain a modified colloidal silica.

30 g of ethylenediamine was then added to enhance the polishing speed, obtaining a concentrated polishing composition.

EXAMPLE 3

1 kg of "Syton HT-50" (same as used in Example 1) as colloidal silica, which was previously treated with a cationic exchange resin to remove alkali metal ions from the aqueous phase and to acidify, was mixed under agitation with 50 g of trimethylchlorosilane to react silanol groups on the surface of the silica particles in the acidified colloidal silica with the trimethylchlorosilane, achieving trimethylsilylation.

The reaction was carried out in the presence of an anionic exchange resin to remove chloride ions released. The anionic exchange resin used was "Dia-Ion SA10A" (same as used in Example 1). The resin was used in an amount of 10 ml. The reaction was carried out at room temperature for over 1 hour. After the completion of the reaction, the ion exchange resin was filtered out to obtain a modified colloidal silica.

30 g of ethylenediamine was then added to enhance the polishing speed, obtaining a concentrated polishing composition.

EXAMPLE 4

1 kg of "Syton HT-50" (same as used in Example 1) as colloidal silica was mixed under agitation with 1 g of hexamethyldisilazane, to react silanol groups on the surface of the silica particles in the colloidal silica with the hexamethyldisilazane, achieving trimethylsilylation. This reaction releases amonia, which decreases the hydrogen ion concentration, and the pH value of the colloidal silica increases.

The reaction was carried out at room temperature for over 2 hours to obtain a modified colloidal silica as a concentrated polishing composition.

EXAMPLE 5

"Syton HT-50" (same as used in Example (1) was used as colloidal silica, which was previously treated with a cationic exchange resin to remove alkali metal ions from the aqueous phase and to acidify.

1 kg of the acidified colloidal silica was mixed under agitation with 1 g of hexamethyldisilazane to react silanol groups on the surface of the silica particles in the acidified colloidal silica with the hexamethyldisilazane, achieving trimethylsilylation.

30 g of ethylenediamine was then added to enhance the polishing speed, obtaining a concentrated polishing composition.

EXAMPLE 6

1 kg of "Syton HT-50" (same as used in Example 1) as colloidal silica, which was previously treated with a cationic exchange resin to remove alkali metal ions from the aqueous phase and to acidify, was mixed under agitation with 50 g of hexamethyldisilazane to react silanol groups on the surface of the silica particles in the acidified colloidal silica with the hexamethyldisilazane, achieving trimethylsilylation. The reaction was carried out at room temperature for over 1 hour.

30 g of ethylenediamine was then added to enhance the polishing speed, obtaining a concentrated polishing composition.

Comparative Example 1 kg of "Syton HT-50" (same as used in Example 1) as colloidal silica was mixed with 30 g of ethylenediamine to obtain a concentrated polishing composition.

5 ml each of the concentrated polishing compositions prepared by the methods described in Examples 2 to 3 and Comparative Example were allowed to stand at 40° C. for 1 day to obtain dry solids. These dry solids were tested by pressing with fingers. The results are shown in Table 1.

The concentrated polishing compositions prepared by the methods described in Examples 1 to 3 and Comparative Example were diluted with water to 20 times the original volume to obtain slurry-formed polishing compositions, and 15 liters each of these polishing compositions were used as polishing fluids. Polishing was performed while recycling the polishing fluids at a rate of 1.5 liter/mon. A crystal orientation [100], phosphorous-doped N-type silicon wafer was polished for 20 min., at a polishing pressure of 350 g/cm$^2$, a relative speed between the polishing cloth and the silicon wafer of 1 m/sec., and a polishing fluid temperature of 35° C. The polishing was performed using the Speed Farm SPAW36 polishing machine and anon-woven fabric type polishing cloth.

The polishing speeds and generation of OSF (oxidation stacking fault) are shown in Table 1. OSF occurs during the formation of a thermal oxidation film on a silicon wafer due to a high oxidation speed of crystal defects, and generation of which is used to evaluate the number of crystal defects of silicon wafers used in devices. The greater the value, the less preferable the wafer.

TABLE 1

| Composition type | Pressing test | Polishing speed (μm/min) | OSF density (pc/cm$^2$) |
| --- | --- | --- | --- |
| Example 1 | Readily pulverized | 0.5 | 5 |
| Example 2 | Readily pulverized | 1.1 | 10 |
| Example 3 | Divided into glass-like, skin-hurting small pieces | 0.1 | 0 |
| Comparative | Divided into glass- | 1.1 | 100,000 |

TABLE 1-continued

| Composition type | Pressing test | Polishing speed (μm/min) | OSF density (pc/cm²) |
|---|---|---|---|
| Example | like, skin-hurting small pieces | | |

In the above Examples, trimethylsilylation rates of silanol groups on the surface of the silica particles were 0.5%, 0.7%, and 21%, respectively, for Examples 1, 2, and 3.

The above-described results expressly indicate that the inventive concentrated polishing composition, comprising the modified colloidal silica with silanol groups on the surface of the silica particles partly trimethylsilylated with hexamethyldisilazane, has a remarkably reduced hardness of its dried gel product compared to those of concentrated polishing compositions using conventional art colloidal silica, which is also seen in the hardness of dried gel products of the individual polishing slurry compositions. Furthermore, this enables suppressed generation of silica particle agglomerations also in the polishing slurry composition and, in high-speed polishing with combined use of ethylenediamine, considerably suppresses the generation of OSF.

I claim:

1. A method for treating a colloidal silica comprising:
   (A) forming an aqueous colloidal silica dispersion from an aqueous sodium silicate solution,
   (B) mixing a trialylhalosilane with said aqueous colloidal silica dispersion to trialkylsilylate a part of silanol groups on a surface of silica particles of said colloidal silica.

2. The method of claim 1, wherein said colloidal silica has a silica concentration of 20 to 50% by weight and a particle 5 to 1000 μm.

3. The method of claim 1, wherein said trialkylhalosilane is trimethylchlorosilane or trimethylbromosilane.

4. The method of claim 1, wherein said colloidal silica is treated with a cationic exchange resin to remove the alkali metal ion contained therein.

5. The method of claim 1, wherein said trialkysilylation is reacted with said colloidal silica for 30 minutes to 10 hours.

6. The method of claim 1, wherein said trialkysilylation is achieved by mixing 0.1 to 5% by weight, based on the weight of silica in said colloidal silica, of a trialkylhalosilane.

* * * * *